(12) United States Patent
Taylor et al.

(10) Patent No.: US 7,273,398 B2
(45) Date of Patent: Sep. 25, 2007

(54) ELECTRICAL DEVICE CARRIER CONTACT ASSEMBLY

(75) Inventors: Attalee S. Taylor, Palmyra, PA (US); Jeffrey B. McClinton, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/264,450

(22) Filed: Nov. 1, 2005

(65) Prior Publication Data

US 2007/0099448 A1 May 3, 2007

(51) Int. Cl.
*H01R 13/66* (2006.01)

(52) U.S. Cl. ........................................ 439/620
(58) Field of Classification Search ............... 439/76.2, 439/73, 620, 621; 361/772, 773, 767, 760
See application file for complete search history.

(56) References Cited

U.S. PATENT DOCUMENTS

| 3,899,719 | A | * | 8/1975 | Murphy ....................... 361/773 |
| 5,374,205 | A | | 12/1994 | Ohashi |
| 6,088,234 | A | * | 7/2000 | Ishikawa et al. ............. 361/760 |
| 6,702,595 | B2 | * | 3/2004 | Nelson et al. ................. 439/83 |
| 2005/0136710 | A1 | * | 6/2005 | Adell ........................... 439/81 |

* cited by examiner

*Primary Examiner*—Tulsidas C. Patel
*Assistant Examiner*—Harshad C Patel

(57) ABSTRACT

An electrical device carrier contact assembly for installation on a circuit board is disclosed. The contact assembly includes a first electrical contact having a first mounting portion and a first receptacle contact portion; a second electrical contact having a second mounting portion and a second receptacle contact portion; and an electrical device secured to the first mounting portion and to the second mounting portion. The electrical device carrier contact assembly is configured to be manipulated and installed on the circuit board as a single unit. A PCB assembly includes a PCB and the electrical device carrier contact assembly inserted by an insertion tool.

16 Claims, 12 Drawing Sheets

ELECTRICAL DEVICE CARRIER CONTACT ASSEMBLY

BACKGROUND

1. Technical Field

The present disclosure relates to electrical device carrier contact assemblies and, more particularly, to electrical device carrier contact assemblies for fuses for printed circuit boards (PCB) and a PCB assembly configured so as to reduce installation costs of the electrical device carrier contact assemblies.

2. Discussion of Related Art

Prior art fuses for printed circuit boards are configured of wire lead type fuses with mini spring sockets soldered to the PCB. These fuses must be prepared by means of clipping the leads to the proper length, and bending wires to align with the PCB mini spring socket holes. The leads must then be manually guided into the PCB mini spring sockets that lie in between tightly positioned connectors.

A need exists to eliminate the preparation steps involving the wire leads, the soldering of the mini spring sockets to the PCB, and to facilitate the assembly and mounting of a fuse to the PCB, and to provide a smaller fuse assembly for mounting on a crowded PCB.

SUMMARY

The present disclosure relates to a fuse carrier contact assembly having press fit tail pins or posts which can be directly inserted into holes of the PCB without the soldering or alignment steps necessary for prior art fuses.

One embodiment of the present disclosure relates to an electrical device carrier contact assembly for an electrical device for installation on a printed circuit board (PCB). The electrical device carrier contact assembly includes a first electrical contact having a first mounting portion and a first receptacle contact portion; a second electrical contact having a second mounting portion and a second receptacle contact portion; and an electrical device secured to the first mounting portion and to the second mounting portion, wherein the electrical device carrier contact assembly is configured to be manipulated and installed on the circuit board as a single unit.

One embodiment of the present disclosure relates to a printed circuit board assembly including a printed circuit board (PCB); at least two sockets electrically coupled thereto and disposed upon a first surface of the PCB. The PCB includes a region upon the first surface of the PCB disposed between the at least two sockets, the region having at least two receptacle members enabling electrical contact with the PCB; and an electrical device carrier contact assembly electrically coupled to the PCB. The electrical device carrier contact assembly includes a first electrical contact having a first mounting portion and a first receptacle contact portion; a second electrical contact having a second mounting portion and a second receptacle contact portion; and an electrical device secured to the first mounting portion and to the second mounting portion, wherein the electrical device carrier contact assembly is configured to be manipulated and installed on the circuit board as a single unit.

DETAILED DESCRIPTION

Figure 1A:
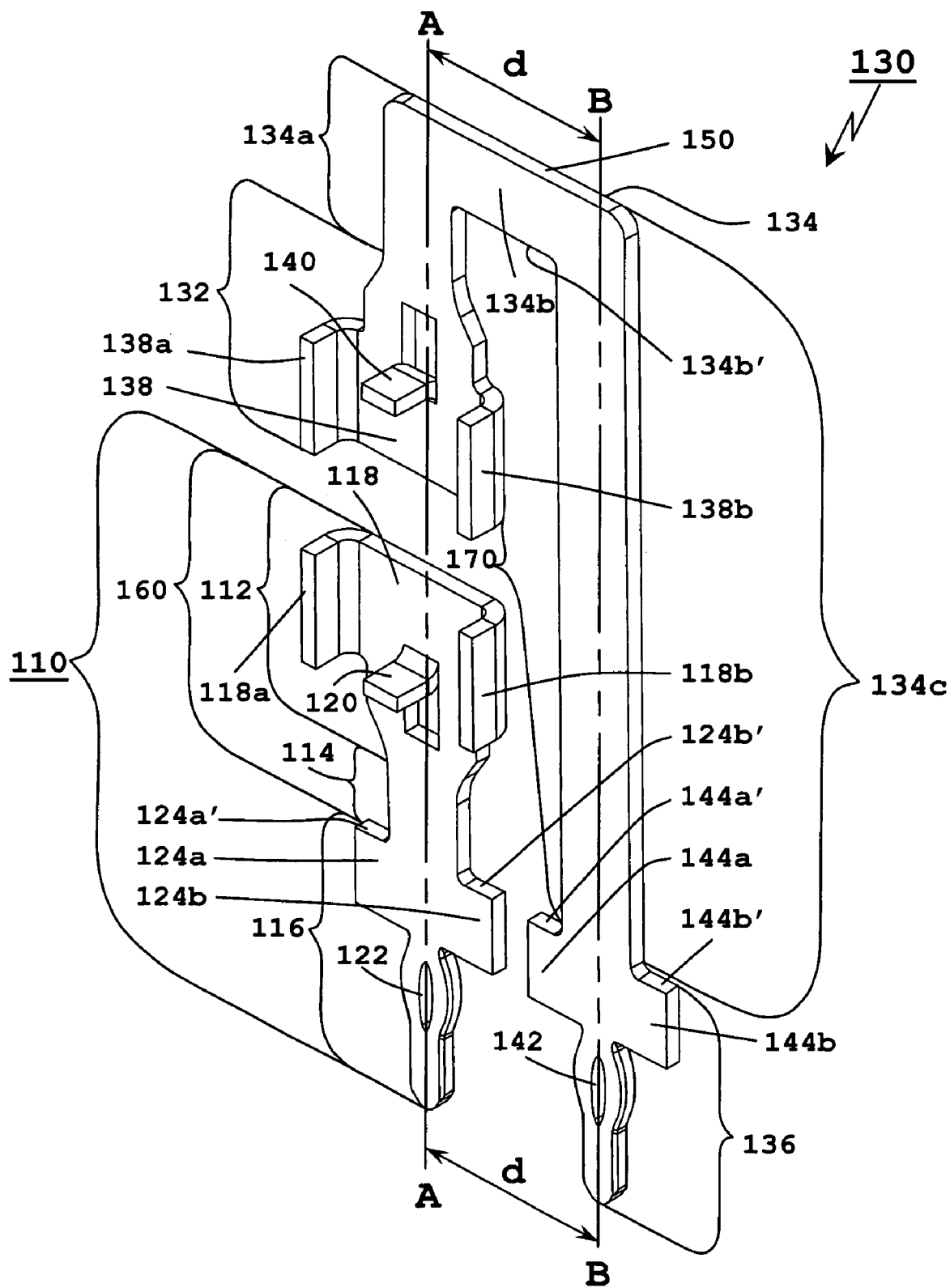
FIG. 1A is perspective view of a portion of an electrical device carrier contact assembly according to one embodiment of the present disclosure.

The present disclosure will be understood more fully from the detailed description given below and from the accompanying drawings of particular embodiments of the disclosure which, however, should not be taken to limit the disclosure to a specific embodiment but are for explanatory purposes.

Numerous specific details may be set forth herein to provide a thorough understanding of a number of possible embodiments of the present disclosure. It will be understood by those skilled in the art, however, that the embodiments may be practiced without these specific details. In other instances, well-known methods, procedures, components and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments disclosed herein are not necessarily limited in this context.

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Embodiments of the presently disclosed electrical connector will now be described in detail with reference to the drawing figures wherein like reference numerals identify similar or identical elements. As used herein and as is traditional, the term "distal" refers to that portion which is furthest from the user while the term "proximal" refers to that portion which is closest to the user. In addition, terms such as "above", "below", "forward", "rearward", etc. refer to the orientation of the figures or the direction of components and are simply used for convenience of description.

Figure 2A:
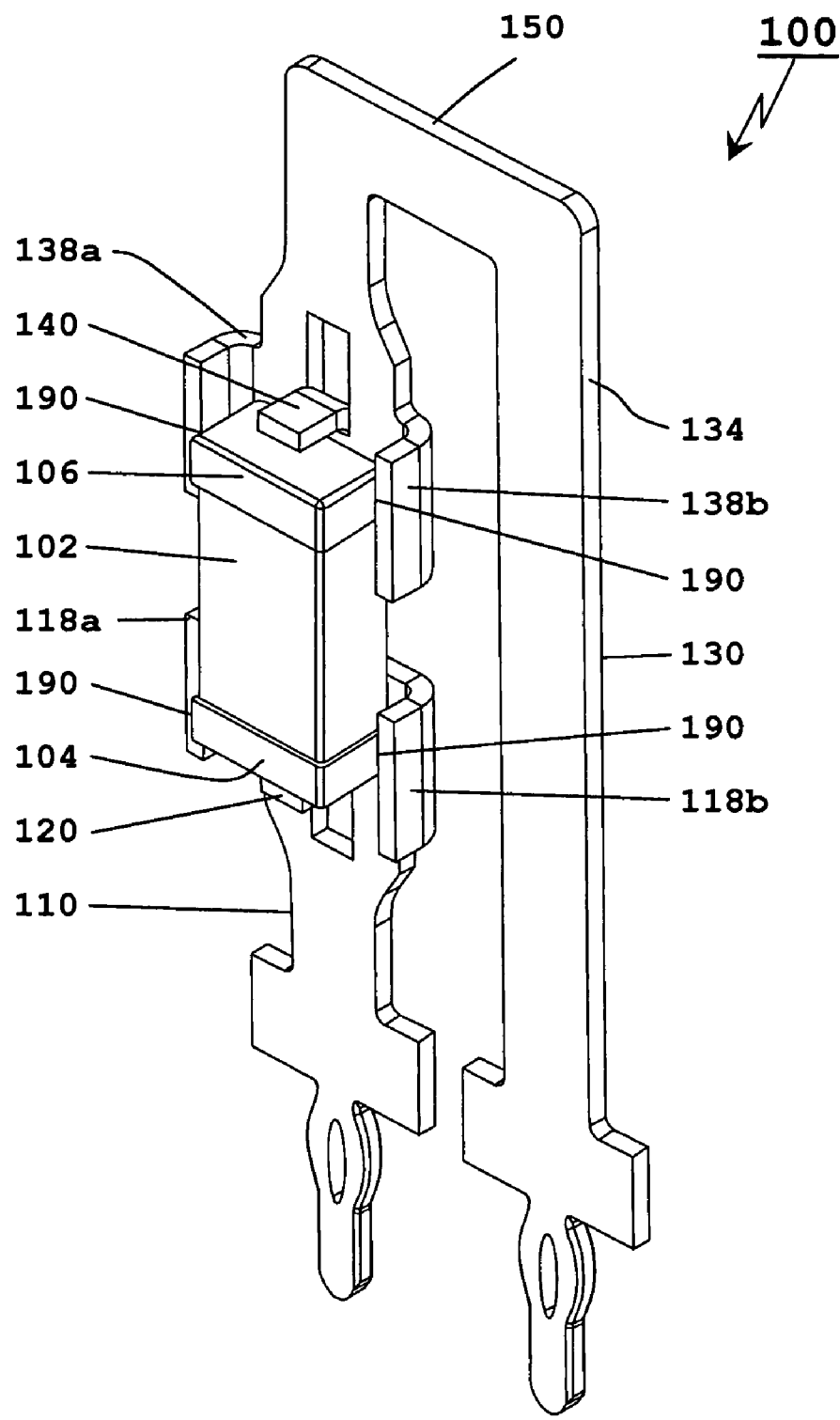
FIG. 2A is a perspective view of an electrical device carrier contact assembly according to one embodiment of the present disclosure as illustrated in FIG. 1A.

Referring to FIGS. 1A and 2A, an electrical device carrier contact assembly according to an embodiment of the present disclosure is generally designated as 100. The electrical device carrier contact assembly 100 includes a first electrical contact 110 having an electrical device mounting portion 160. The electrical device mounting portion 160 includes an electrical device contact portion 112 and an intermediate extending portion 114 extending from the electrical device contact portion 112 to a receptacle contact portion 116 which is typically substantially linear. The receptacle contact portion 116 includes typically, for example but is not limited to, a compliant or press fit tail member, a feed through pin member, or a bottom of a card edge contact. The receptacle contact portion 116 is illustrated in FIGS. 1A and 2A as a compliant or press fit tail portion.

The receptacle contact portion 116 extends typically from the intermediate extending portion 114. Typically, the first electrical contact 110 has a generally planar configuration except for the electrical device contact portion 112 which typically has a generally U-shaped cross-sectional configuration with a flat central surface 118 bordered by two supporting ribs 118a and 118b extending generally perpendicularly therefrom to form the U-shaped cross-section.

In one embodiment, the electrical device contact portion 112 is also bordered by an electrical device motion limiting or support tab or member 120 which also extends generally perpendicularly from the flat central surface 118. The flat central surface 118 defines a contact surface for an electrical device, as discussed later.

Figure 1B:
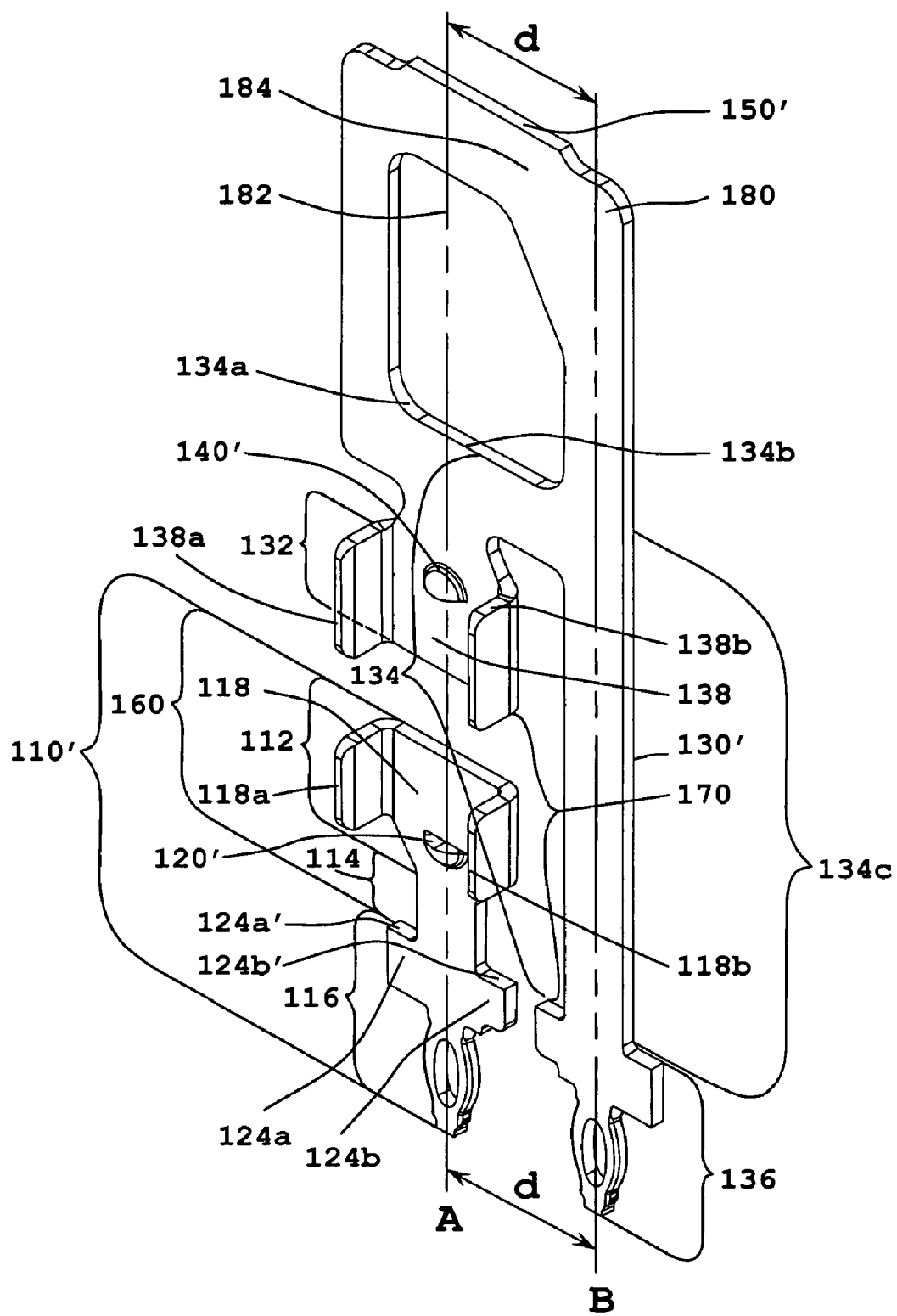
FIG. 1B is a perspective view of a portion of an electrical device carrier contact assembly according to one embodiment of the present disclosure.
Figure 2B:
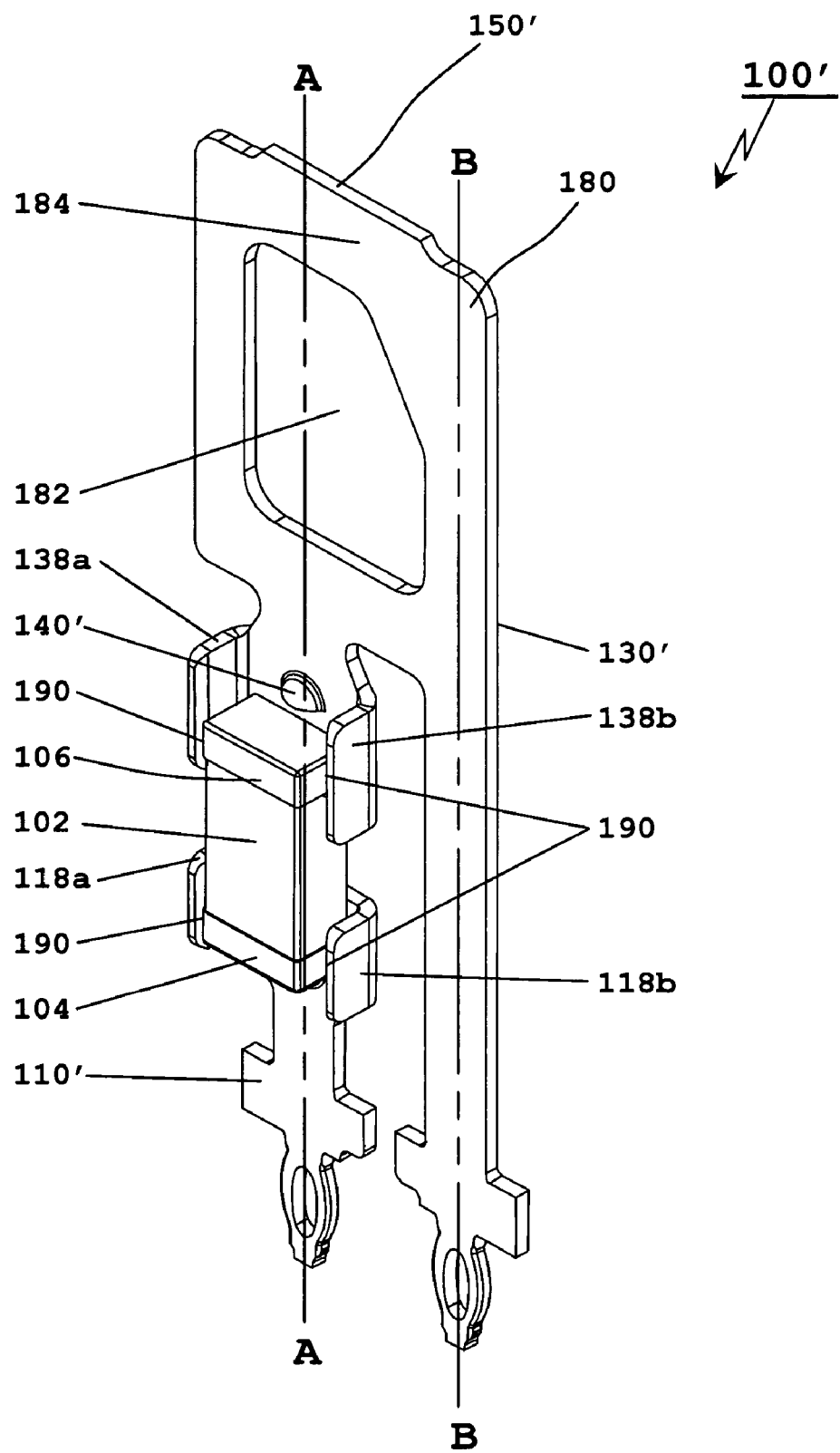
FIG. 2B is a perspective view of an electrical device carrier contact assembly according to one embodiment of the present disclosure as illustrated in FIG. 1B.

The electrical device carrier contact assembly 100 also includes at least a second electrical contact 130 having an electrical device mounting portion 170. The electrical device mounting portion 170 includes an electrical device contact portion 132 and an intermediate extending portion 134 extending from the electrical device contact portion 132. The electrical device carrier contact assembly 100 further includes a substantially linear receptacle contact portion 136 extending from the intermediate extending portion 134. The receptacle contact portion 136 includes typically, for example but is not limited to, a compliant or press fit tail member, a feed through pin member, or a bottom of a card edge contact. The receptacle contact portion 136 is illustrated in FIGS. 1B and 2B also as a compliant or press fit tail portion.

The intermediate extending portion 134 of the second electrical contact 130 is configured typically in a substantially J-shaped arrangement such that the electrical device contact portion 132 of the second electrical contact 130 is offset by a distance "d" from the receptacle contact portion 136 of the second electrical contact 130. More particularly, the J-shaped intermediate extending portion 134 includes a short section 134a which is typically linear, a transverse section 134b, and a long section 134c which is typically linear, with the transverse section 134b extending transversely from the short section 134a and towards the long section 134c such that a reference line A-A drawn along the linear direction of the electrical device contact portion 132 and along the short section 134a is offset by the distance "d" from a reference line B-B drawn along the linear direction of the long section 134c and the receptacle contact portion 136.

The second electrical contact 130 has a generally planar configuration except for the electrical device contact portion 132 which has a generally U-shaped cross-sectional configuration with a flat central surface 138 bordered by two supporting ribs 138a and 138b extending generally perpendicularly therefrom to form the U-shaped cross-section.

In one embodiment, the electrical device contact portion 132 is also bordered by an electrical device motion limiting or support tab or member 140 which also extends generally perpendicularly from the flat central surface 138. The flat central surface 138 defines a contact surface for an electrical device, as discussed later. Typically, the receptacle contact portion 136 includes at least one projection 144a and typically a second projection 144b extending perpendicularly therefrom and which are formed such that the receptacle contact portion 136 is configured as a substantially T-shaped member.

One of ordinary skill in the art will recognize that, rather than a U-shaped configuration, in one embodiment, the electrical device contact portions 112 and 132 may include an entirely flat cross-sectional configuration or in one embodiment a V-shaped cross-sectional configuration. The embodiments are not limited in this context.

Typically, the receptacle contact portion 116, 136 when in the form of a press fit tail portion, includes an aperture 122, 142 disposed therethrough which enables compression fitting of the press fit tail portion to a receptacle of a PCB, as discussed below with respect to FIGS. 6-10.

As a result of the substantially J-shaped configuration of the second electrical contact 130, the receptacle contact or press fit tail portions 116 and 136 facilitate coupling of the electrical device carrier contact assembly 100 as a single unit to the circuit board, such that the electrical device contact portion 112 of the first electrical contact 110 and the electrical device contact portion 132 of the second electrical contact 130 may be substantially linearly aligned with respect to or along an axis perpendicular to a plane or surface of a PCB. However, other orientations are possible also. The embodiments are not limited in this context. Furthermore, one of ordinary skill in the art will recognize that other configurations besides a J-shape may be employed so that the electrical device contact portion 112 of the first electrical contact 110 and the electrical device contact portion 132 of the second electrical contact 130 may be one of linearly aligned with and parallel to the press fit tail portion 116 of the first electrical contact 110.

In one embodiment, the second electrical contact 130 is configured such that the receptacle contact portion 116 of the first electrical contact 110 and the receptacle contact portion 136 of the second electrical contact 130 are offset from one another by the distance "d" which is substantially equal to a distance between complementary through holes of a printed circuit board, discussed below.

The electrical device contact assembly 100 further includes an electrical device 102 having first and second electrical terminals 104 and 106, respectively, wherein the first electrical terminal 104 is electrically coupled to the electrical device contact portion 112 of the first electrical contact 110, via support tab 120, and the second electrical terminal 106 is electrically coupled to the electrical device contact portion 132 of the second electrical contact 130, via support tab 140. The electrical device 102 is typically but not limited to a fuse for a PCB assembly. The electrical device 102 may also be a power supply such as a battery or a power storage device such as a capacitor. The embodiments are not limited in this context.

The electrical device 102 is disposed on the flat central surfaces 118 and 138 between the respective support ribs 118a, 118b and 138a, 138b. The electrical device 102 may be secured by joining to the electrical contact portions 112 and 132 by various means such as by one or more soldered joints 190 between the electrical device 102 and the respective support ribs 118a, 118b and 138a, 138b.

FIGS. 1B and 2B illustrate a variation of the embodiment of an electrical device carrier contact assembly 100 of FIGS. 1A and 2A. More particularly, electrical device carrier contact assembly 100' differs from electrical device carrier contact assembly 100 only in that electrical device carrier contact assembly 100' includes a second electrical contact 130' having the intermediate extending portion 134 which is substantially J-shaped but which further includes a closed loop extension 180 which extends from the long section 134c in a loop to intersect short section 134a to form an aperture 182 disposed therethrough. A proximal end 150' of the contact assembly 100' is now located on the extension 180 and includes a transverse section 184. Also, first electrical contact 110' and second electrical contact 130' include an electrical device motion limiting or support tab or member 120', 140' which also extends perpendicularly from surface 118, 138 but is formed as a protrusion.

Figure 3:
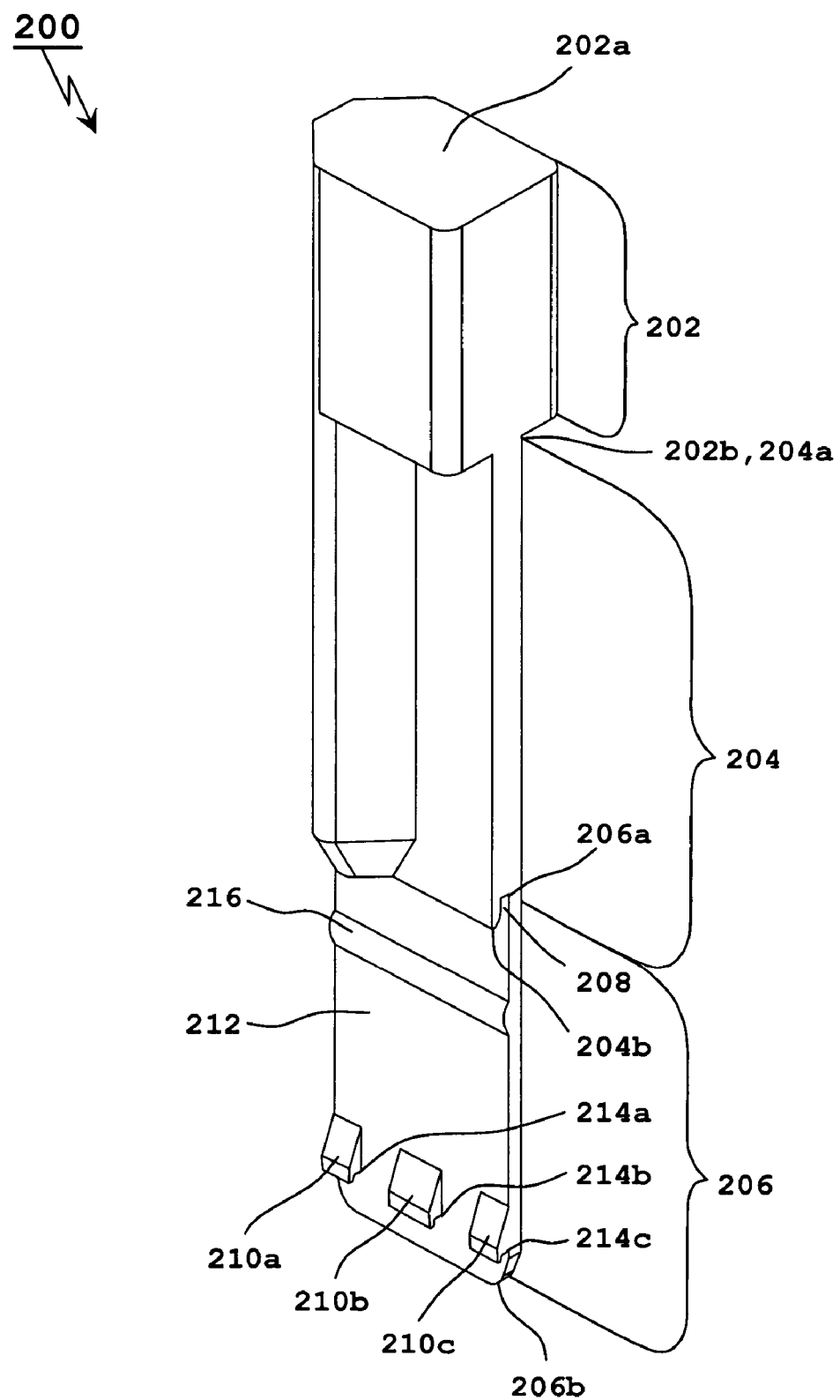
FIG. 3 is a front perspective view of an insertion tool for an electrical device carrier contact assembly according to the present disclosure.
Figure 4:
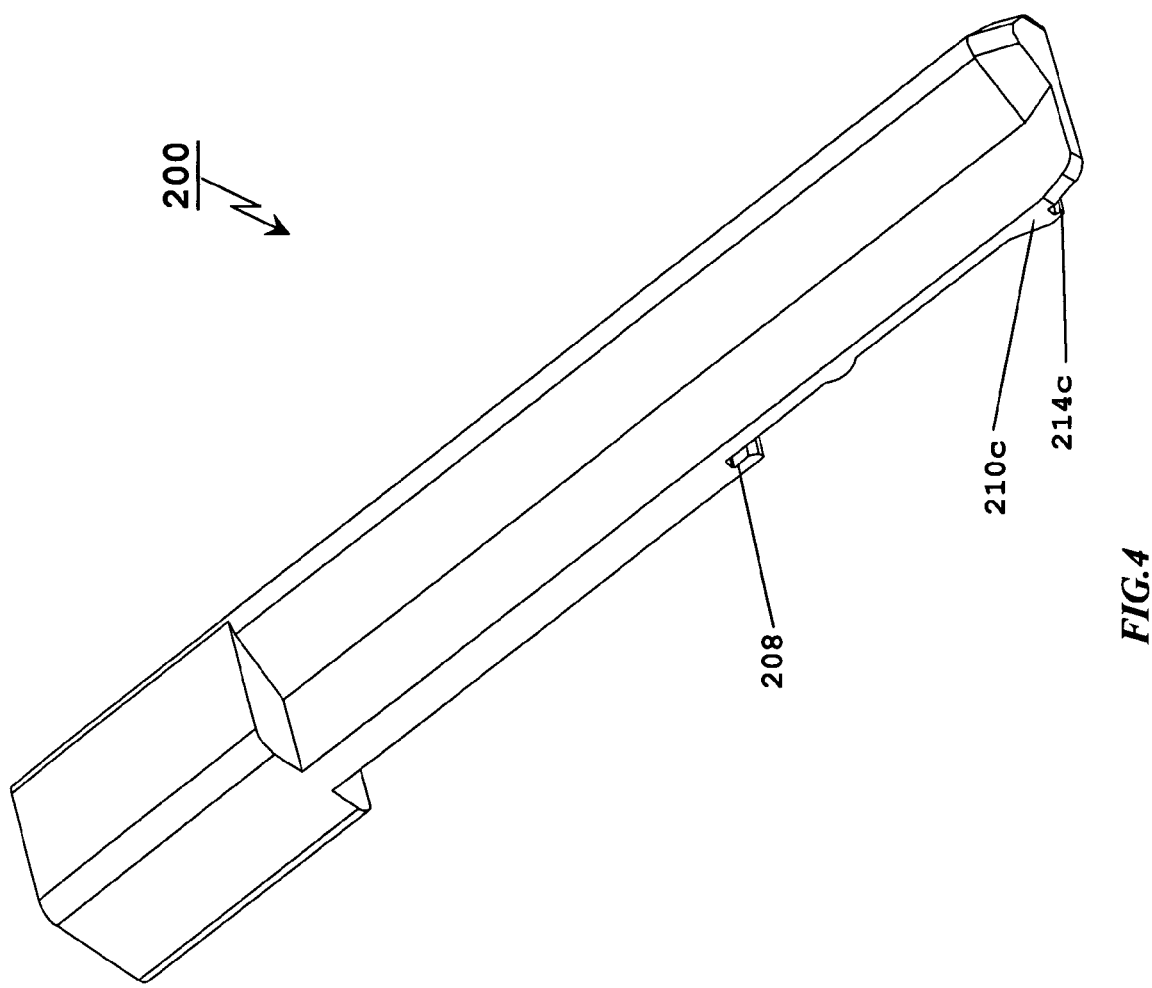
FIG. 4 is rear perspective view of the insertion tool of FIG. 3.
Figure 5:
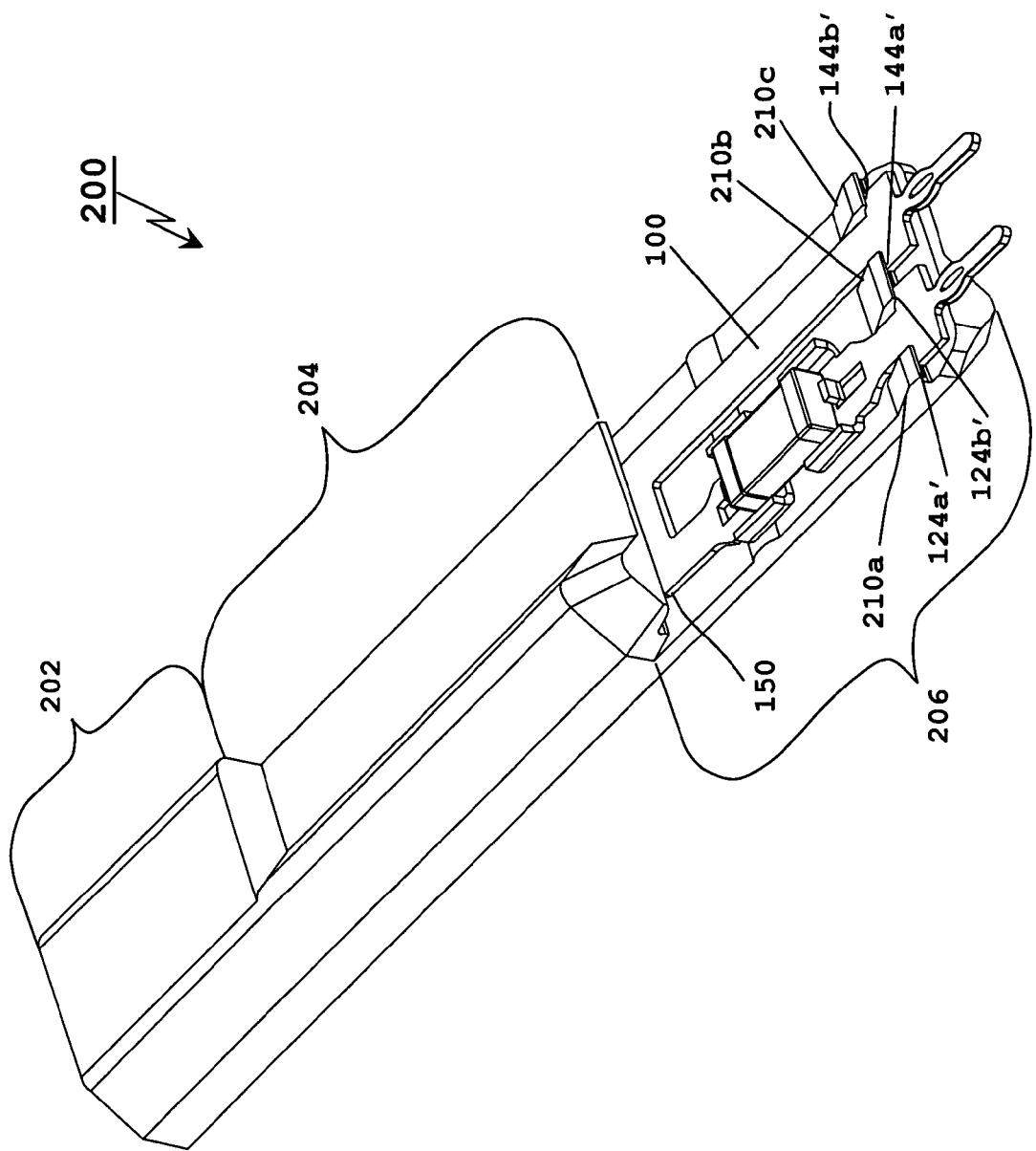
FIG. 5 is a front perspective view of the insertion tool of FIG. 3 which includes the electrical device carrier contact assembly according to the present disclosure.
Figure 6:
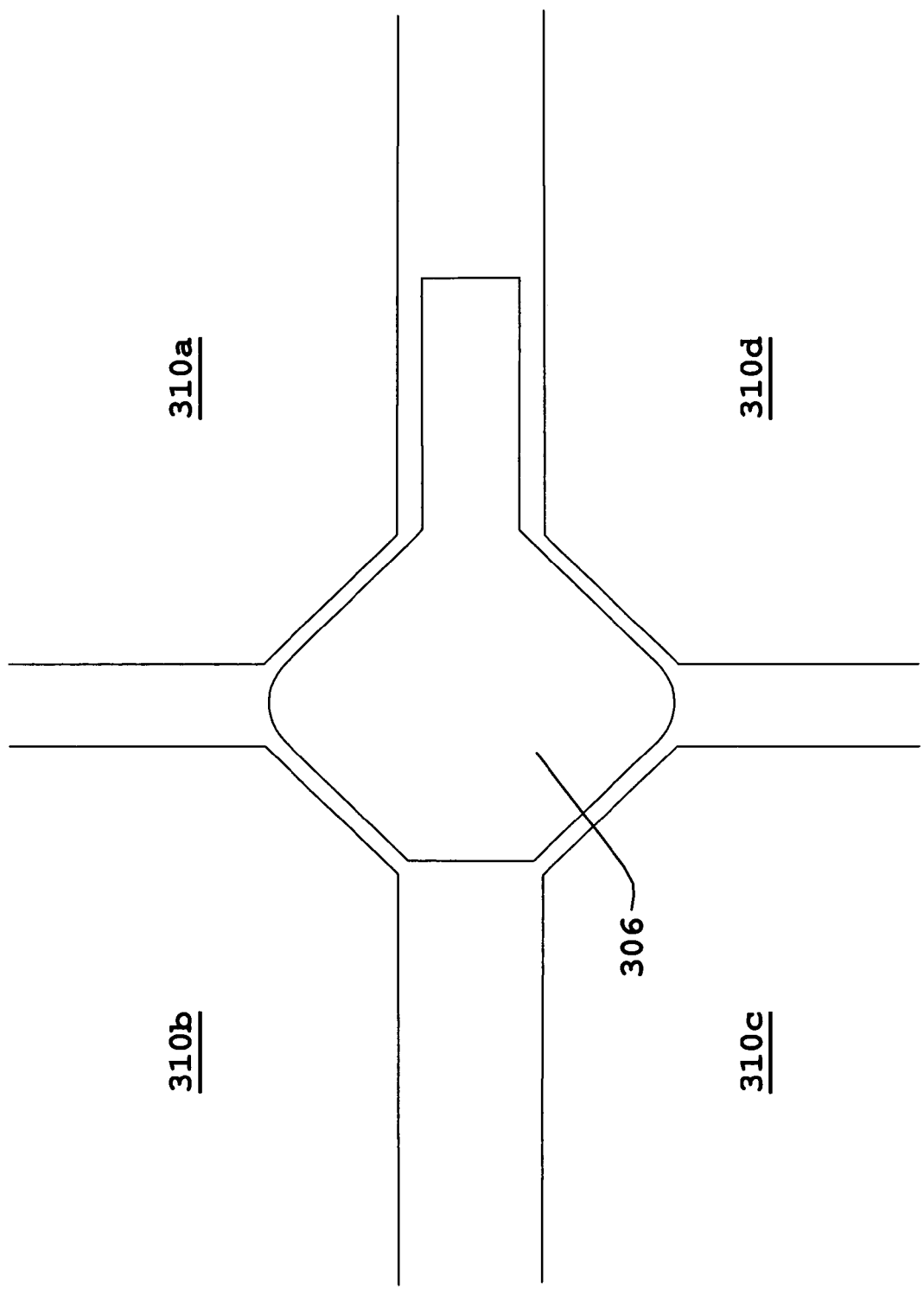
FIG. 6 is a plan view of a PCB assembly according to the present disclosure.
Figure 7:
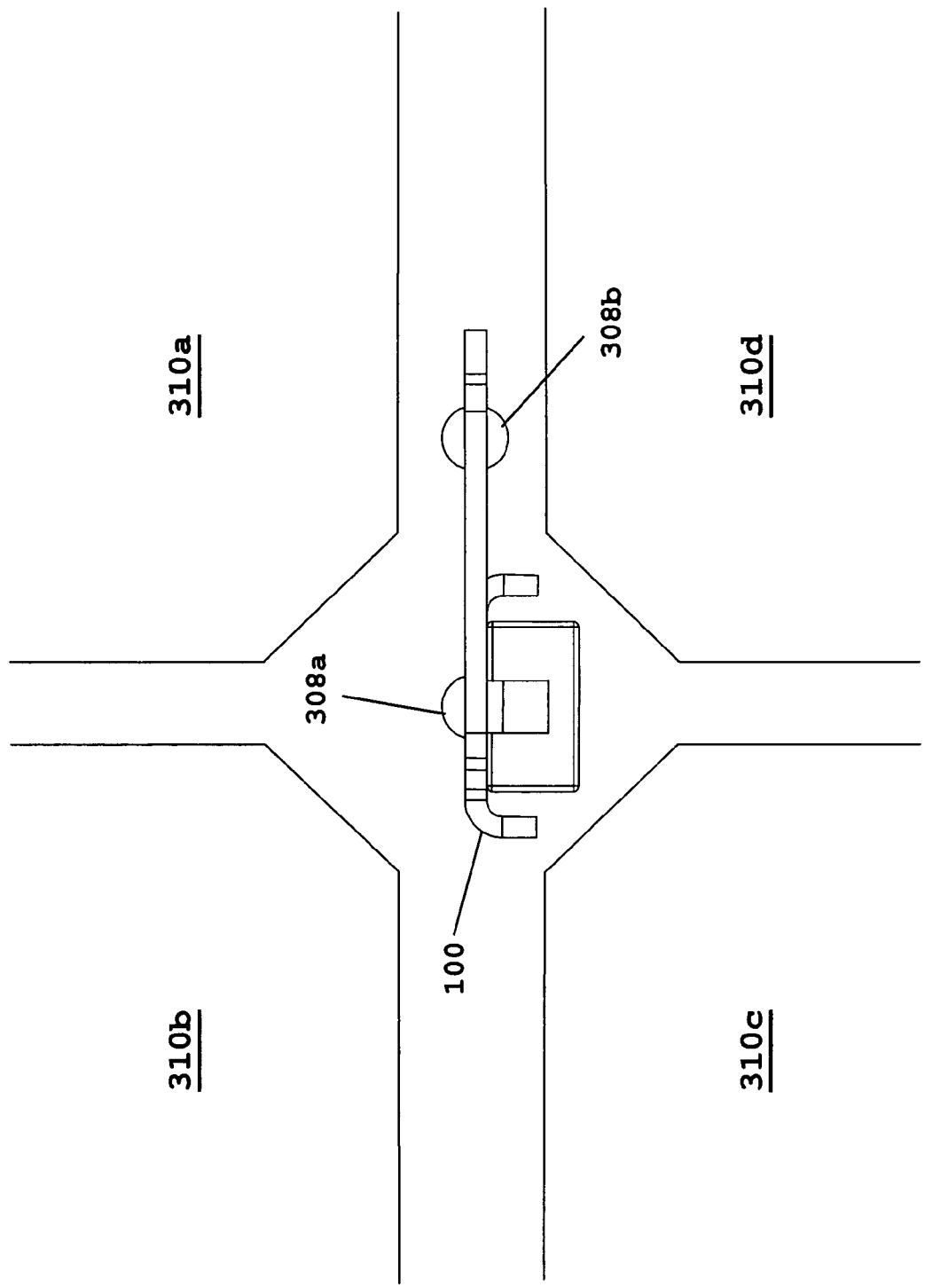
FIG. 7 is a plan view of the PCB assembly and the electrical device carrier contact assembly according to the present disclosure.
Figure 8:
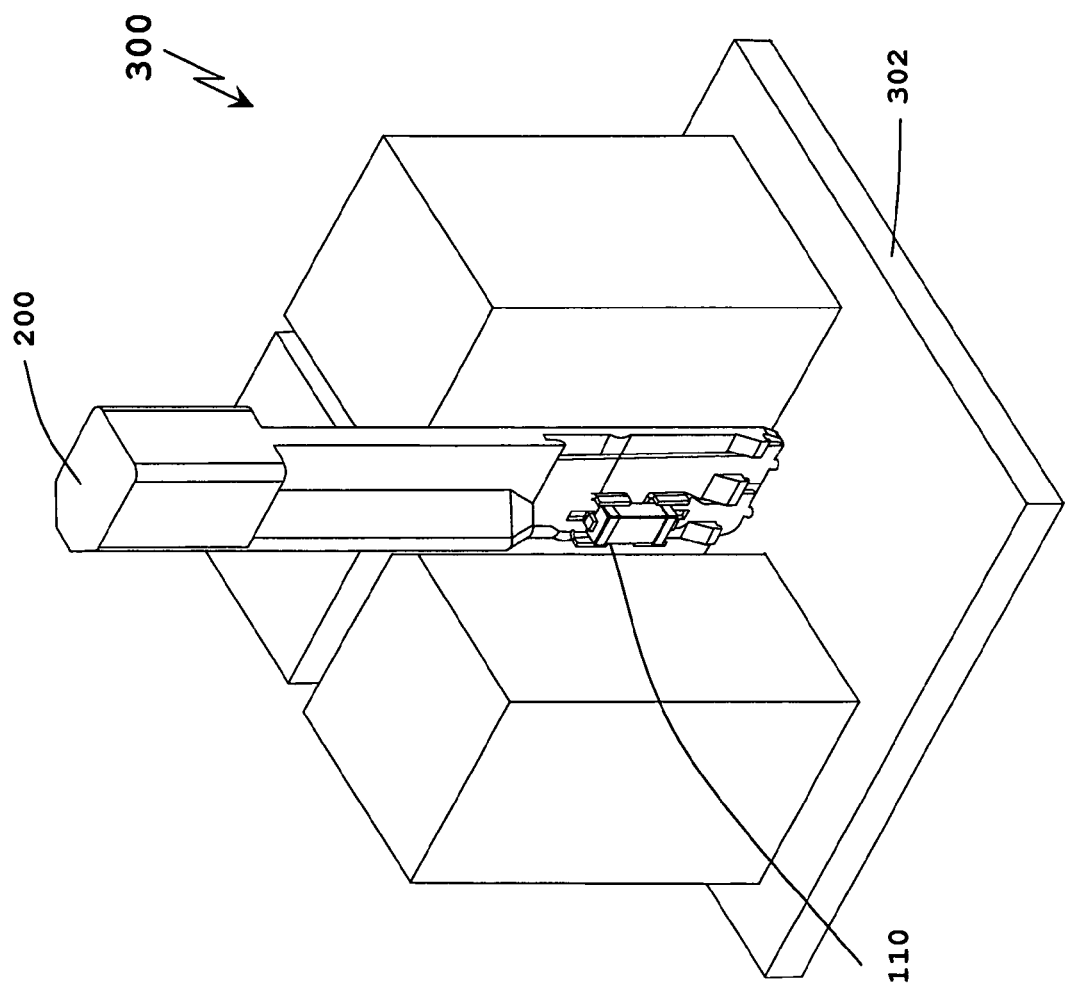
FIG. 8 is a perspective view of the PCB assembly with the insertion tool and the electrical device carrier contact assembly according to the present disclosure.

FIGS. 3-5 disclose an insertion tool 200 for inserting the electrical contact assembly 100 to a printed circuit board 302 of a printed circuit board (PCB) assembly 300 (see FIG. 8). FIGS. 6-10 illustrate that the PCB 302 includes a region 306 upon a first surface 304 of the PCB 302. The region 306 is disposed between at least two sockets, and typically four sockets 310a, 310b, 310c, and 310d which are electrically coupled to the PCB 302 to form the PCB assembly 300. The region 306 includes at least two through holes 308a and 308b extending therethrough to a second surface 312 of the PCB 302.

Referring again to FIGS. 3-5, the insertion tool 200 includes a grasping portion 202 for grasping the insertion tool, the grasping portion having a proximal end 202a and a distal end 202b. The insertion tool 200 further includes an extension portion 204 extending from the distal end 202b of the grasping portion 202, the extension portion having a proximal end 204a coinciding with distal end 202b of the grasping portion 202, and a distal end 204b. The insertion tool 200 further includes an electrical contact assembly portion 206 extending from the extension portion 204, the electrical contact assembly portion 206 having a proximal end 206a and a distal end 206b.

The distal end 204b of the extension portion 204 partially overlaps the proximal end 206a of the electrical contact assembly portion 206 so that a groove or slot 208 is formed transversely in the insertion tool 200 thereacross. The groove or slot 208 is configured to engage the electrical contact assembly 100 at a proximal end 150 formed by the J-shaped intermediate extending portion 134, i.e., at the transverse section 134b.

Only electrical contact assembly 100 is shown in FIG. 5, but one of ordinary skill in the art will recognize that, and understand how, electrical contact assembly 100' may be engaged by insertion tool 200, by engaging the electrical contact assembly 100' at the proximal end 150'.

The electrical contact assembly portion 206 includes a set of at least two, and typically at least three adjacent protrusions 210a, 210b, and 210c spaced apart to accommodate the intermediate extending portions 114 and 134 of the electrical contact assembly 100 disposed therebetween. The at least two adjacent protrusions 210a, 210b, 210c extend outwardly from, and partially overlap, a surface 212 of the electrical contact assembly portion 206 so as to each form a groove or slot 214a, 214b, and 214c to engage a proximal end 124a', 124b', 144a', 144b' of the at least one projection 124a, 144a, and typically two projections 124a, 124b, 144a, 144b, respectively of the substantially T-shaped member formed by the at least one of the receptacle contact portion 116 of the first electrical contact 110, 110' and the receptacle contact portion 136 of the second electrical contact 130, 130' (see FIGS. 1A, 1B, 2A, 2B).

In addition, the electrical contact assembly portion 206 may include a protrusion 216 extending across the surface 212 of the electrical contact assembly portion 206.

The insertion tool 200 is configured for insertion into the region 306 disposed between the at least two sockets 310a, 310b, 310c and 310d. More particularly, when the electrical contact assembly 100 is engaged on the electrical contact assembly portion 206 such that the proximal end 150 of the intermediate extending portion 134 of the second electrical contact 130 is engaged in the groove or slot 208 formed by the partial overlap of the extension portion 204 over the electrical contact assembly portion 206, and the proximal end 124a', 124b', 144a', 144b' of the at least one projection 124a, 124b, 144a, 144b is engaged by the grooves or slots 214a, 214b, 214c, the protrusion 216 may be employed to flex the electrical contact assembly 100.

Similarly, the proximal end 150' of contact assembly 100' may be engaged in the groove or slot 208 in an analogous manner to flex the contact assembly 100'. The flexure of the electrical contact assembly 100, 100' enables the proximal end 150, 150' of the electrical contact assembly 100, 100' to partially disengage from the groove or slot 208 while the projections 124a, 124b, 144a, 144b of the substantially T-shaped members are fully engaged by their respective grooves or slots 214a, 214b, 214c so as to take the majority of the stresses applied during the insertion process. The groove or slot 208 only touches the proximal end 150, 150' and does not exert any substantial force on the contact assembly 100, 100' at the proximal end 150, 150'.

As can be appreciated from the foregoing discussion, FIGS. 6-10 disclose also that the electrical device carrier contact assembly 100, 100' is configured for engaging with the insertion tool 200.

As illustrated in FIGS. 6-10, the present disclosure relates also to PCB assembly 300 which includes PCB 302, at least two sockets, and typically at least four sockets 310a, 310b, 310c and 310d electrically coupled thereto and disposed upon the first surface 304 of the PCB 302. The PCB 302 includes the region 306 upon the first surface 304 of the PCB 302 disposed between the at least two sockets 310a, 310b, 310c and 310d, the region 306 having at least two through holes 308a, 308b extending therethrough to a second surface 312 of the PCB 302; and the electrical device carrier contact assembly 100. The electrical device carrier contact assembly 100 includes all of the features previously described.

In addition, the receptacle contact or press fit tail portions 116 and 136 each include the respective apertures 122 and 142 such that the aperture 122 of the press fit tail portion 116 of the first electrical contact 110 and the aperture 142 of the press fit tail portion 136 of the second electrical contact 130 are each compressed during insertion through one of the at least two through holes 308a, 308b so as to cause electrical contact with the PCB 302 via the circumferential surfaces forming the at least two through holes 308a, 308b which function as receptacles for the receptacle contact portions 116 and 136.

In particular, the second electrical contact 130 is configured such that the first receptacle contact or press fit tail portion 116 of the first electrical contact 110 and the second receptacle contact or press fit tail portion 136 of the second electrical contact 130 are offset from one another by the distance "d" which is substantially equal to the distance between the receptacle members or complementary through holes 308a, 308b of the PCB 302.

Figure 9:
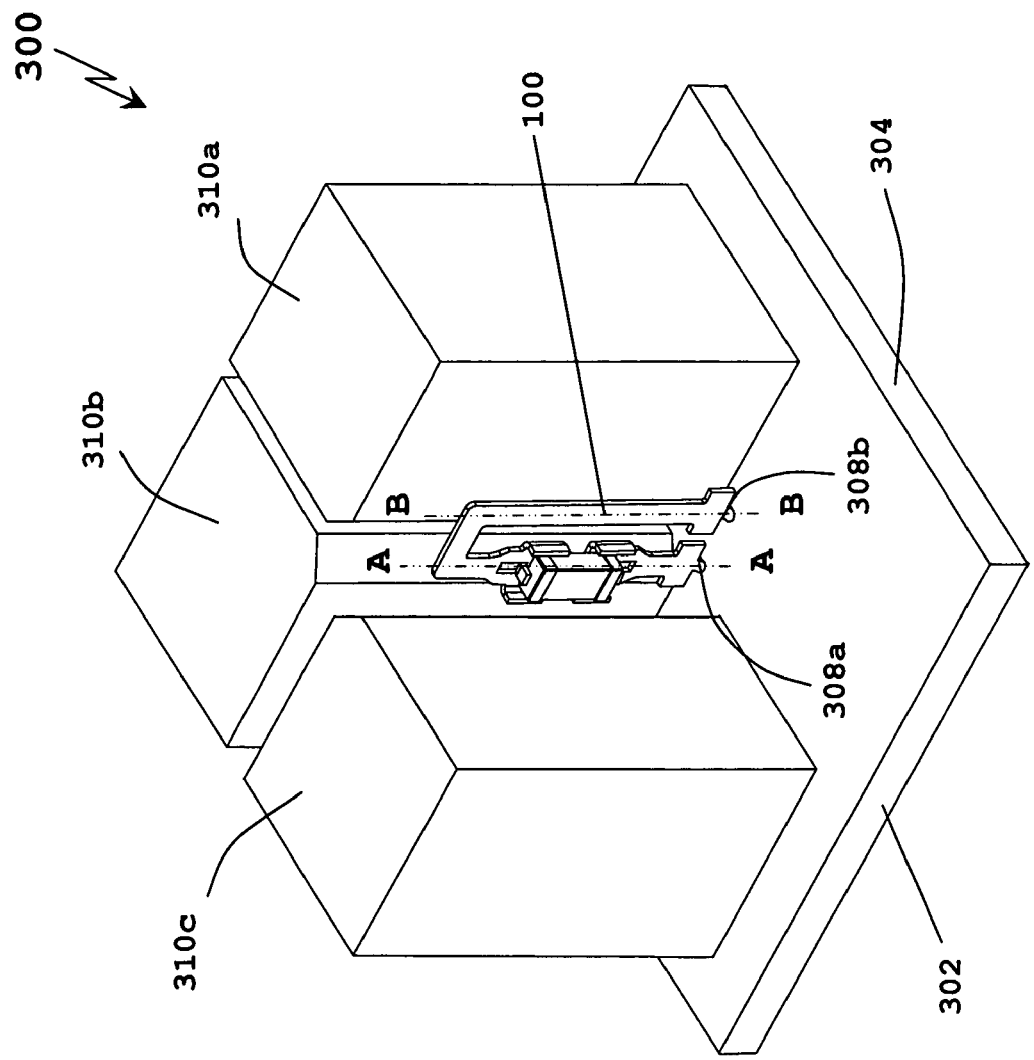
FIG. 9 is a perspective view of the PCB assembly and the electrical device carrier contact assembly according to the present disclosure.
Figure 10:
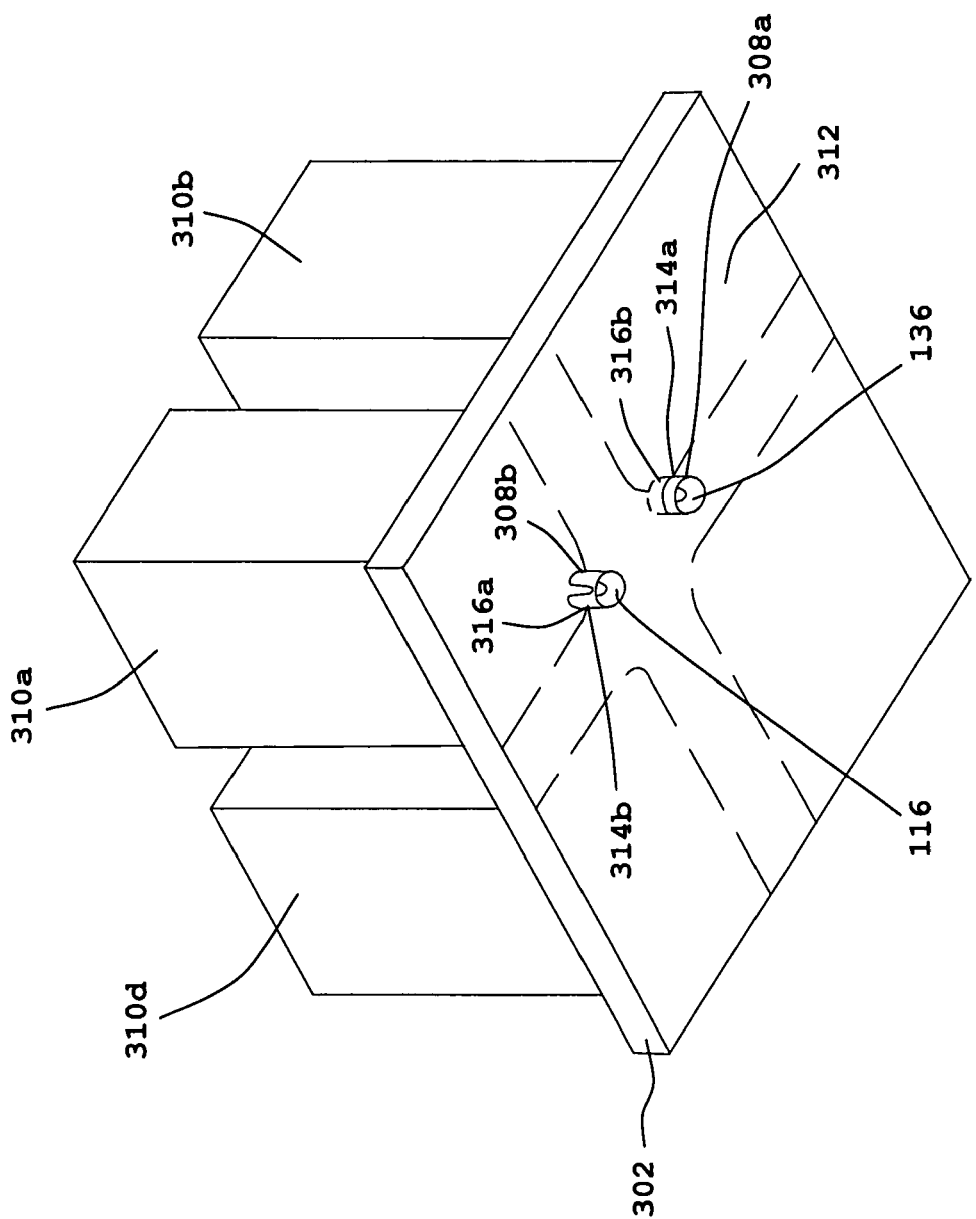
FIG. 10 is a bottom perspective view of the PCB assembly and the electrical device carrier contact assembly according to the present disclosure.

As best shown in FIG. 9, the first device contact portion 112 and second device contact portion 132 are typically substantially linearly aligned and perpendicular to the first surface 304 of the PCB 302, although other orientations are possible. The embodiments are not limited in this context.

The PCB assembly 300 also includes the electrical device 102 having first and second electrical terminals 104 and 106, respectively, wherein the first electrical terminal 104 is electrically coupled to the electrical device contact portion 112 of the first electrical contact 110, via support tab 120, and the second electrical terminal 106 is electrically coupled to the electrical device contact portion 132 of the second electrical contact 130, via support tab 140.

Again, the electrical device 102 is typically but not limited to a fuse. The electrical device 102 may also be a power supply such as a battery or a power storage device such as a capacitor. The embodiments are not limited in this context.

Once the electrical contact assembly 100, 100' is inserted into the PCB assembly 300, typically via the insertion tool 200, electrical power may be supplied to the first electrical contact 110 and to the second electrical contact 130 for a period of time, commonly referred to as the burn-in period, so as to burn in the semiconductor materials of the PCB assembly 300.

As can be appreciated from the foregoing description, the electrical device carrier contact assembly 100, 100' is configured to be manipulated and installed on the PCB 302 as a single unit. The manipulation and installation of the electrical device carrier contact assembly 100, 100' is facilitated by the substantially linear receptacle contact portions 116 and 136.

Should pre-mature failure of the semiconductor materials occur during the burn-in period, a tool (not shown) having a grasping feature such as a hook end may be applied to an underside 134b' of the transverse section 134b at the proximal end 150 of the electrical device carrier contact assembly 100, or in similar manner at the proximal end 150', of electrical device carrier contact assembly 100', (see FIGS. 1A, 1B, 2A, 2B) so that the electrical contact assembly 100 may be readily removed from the remainder of the PCB assembly 300 by an upward motion away from the surface 304 of the PCB 302 such that the press fit tail portions 116 and 136 disengage from their respective through holes 308a, 308b. If performance of the semiconductor materials is satisfactory during the burn-in period, the electrical device carrier contact assembly 100 may be left in place.

In one embodiment, the at least two through holes 308a, 308b further include mini-spring sockets 314a, 314b, respectively, which are each in contact with the PCB 302 via the circumferential surfaces forming the at least two through holes 308a, 308b. The mini-spring sockets 314a and 314b include round collars 316a and 316b, respectively. The receptacle contact or press fit tail portions 116 and 136 now engage into the round collars 316a, 316b of the mini-spring sockets 314a, 314b, respectively, thereby causing electrical contact with the PCB 302.

The described embodiments of the present disclosure are intended to be illustrative rather than restrictive, and are not intended to represent every embodiment of the present disclosure. Various modifications and variations can be made without departing from the spirit or scope of the disclosure as set forth in the following claims both literally and in equivalents recognized in law.

What is claimed is:

1. An electrical device carrier contact assembly for installation on a circuit board, comprising:
   a first electrical contact having a first mounting portion and a first press fit tail portion;
   a second electrical contact having a second mounting portion and a second press fit tail portion, wherein the second mounting portion includes an intermediate extending portion extending to the second press fit tail portion, and the intermediate extending portion is configured in a substantially J-shaped arrangement such that at least a portion of the second mounting portion is offset from the second press fit tail portion; and
   an electrical device soldered to the first mounting portion and to the second mounting portion;
   wherein the electrical device carrier contact assembly is configured to be manipulated and installed on the circuit board as a single unit.

2. An electrical device carrier contact assembly for installation on a circuit board, comprising:
   a first electrical contact having a first mounting portion and a first receptacle contact portion;
   a second electrical contact having a second mounting portion and a second receptacle contact portion, wherein the second mounting portion includes an intermediate extending portion extending to the second receptacle contact portion, and the intermediate extending portion is configured in a substantially J-shaped arrangement such that at least a portion of the second mounting portion is offset from the second receptacle contact portion; and
   an electrical device secured to the first mounting portion and to the second mounting portion;
   wherein the electrical device carrier contact assembly is configured to be manipulated and installed on the circuit board as a single unit.

3. The electrical device contact assembly according to claim 2, wherein the intermediate extending portion configured in a substantially J-shaped arrangement further includes a closed loop extension having an aperture disposed therethrough.

4. A printed circuit board assembly comprising:
   a printed circuit board (PCB);
   at least two sockets electrically coupled thereto and disposed upon a first surface of the PCB,
   the PCB including a region upon the first surface of the PCB disposed between the at least two sockets, the region having at least two through holes enabling electrical contact with the PCB; and
   an electrical device carrier contact assembly electrically coupled to the PCB, the electrical device carrier contact assembly including:
   a first electrical contact having a first mounting portion and a first receptacle contact portion configured for a press fit within one of the at least two through holes;

a second electrical contact having a second mounting portion and a second receptacle contact portion configured for a press fit within another of the at least two through holes;

wherein at least one of the first receptacle contact portion and the second receptacle contact portion includes at least one projection extending perpendicularly therefrom and formed such that the at least one of the first receptacle contact portion and the second receptacle contact portion is configured as a substantially T-shaped member; and an electrical device fixedly secured to the first mounting portion and to the second mounting portion, wherein the electrical device carrier contact assembly is configured to be manipulated and installed on the circuit board as a single unit.

5. The printed circuit board assembly according to claim 4, wherein the at least two through holes include collars of mini spring sockets.

6. The printed circuit board assembly according to claim 4, wherein the second electrical contact is configured such that the receptacle contact portion of the first electrical contact and the receptacle contact portion of the second electrical contact are offset from one another by a distance substantially equal to a distance between the at least two receptacle members enabling electrical contact with the printed circuit board.

7. The electrical device carrier contact assembly according to claim 4, further comprising an insertion tool, the insertion tool comprising:

a grasping portion for grasping the insertion tool, the grasping portion having a proximal end and a distal end; and an electrical contact assembly portion extending from the grasping portion, the electrical contact assembly portion having a proximal end and a distal end.

8. The electrical device carrier contact assembly according to claim 7, wherein the first mounting portion and the second mounting portion each comprise an intermediate extending portion, and wherein the intermediate extending portion of the second electrical contact is configured in a substantially J-shaped arrangement such that at least a portion of the second mounting portion is offset from the second receptacle contact portion.

9. The electrical device carrier contact assembly according to claim 8, wherein the electrical contact assembly portion of the insertion tool includes a set of adjacent protrusions spaced apart and having the intermediate extending portions of the first and second mounting portions disposed therebetween.

10. The electrical device carrier contact assembly according to claim 9, wherein the set of adjacent protrusions extend outwardly from, and partially overlap, a surface of the electrical contact assembly portion so as to each form a slot engaging a proximal end of the at least one projection of the substantially T-shaped member formed by the at least one of the first receptacle contact portion and the second receptacle contact portion.

11. The electrical device carrier contact assembly according to claim 7, wherein the distal end of the extension portion of the insertion tool partially overlaps the proximal end of the electrical contact assembly portion so that a slot is formed transversely in the insertion tool thereacross.

12. The electrical device carrier contact assembly according to claim 11, wherein the slot is configured to engage the electrical device carrier contact assembly at a proximal end of the J-shaped arrangement.

13. The electrical device carrier contact assembly according to claim 8, wherein the substantially J-shaped arrangement further comprises a closed loop extension forming an aperture therethrough.

14. The electrical device carrier contact assembly according to claim 13, wherein the slot is configured to engage the electrical device carrier contact assembly at a proximal end of the closed loop extension.

15. The electrical device carrier contact assembly according to claim 7, wherein the electrical contact assembly portion of the insertion tool includes a protrusion extending across a surface of the electrical contact assembly portion.

16. An electrical device carrier contact assembly for installation on a printed circuit board (PCB), the electrical device carrier contact assembly comprising:

a first electrical contact having:

a first mourning portion having a device contact portion; and a substantially linear first receptacle contact portion extending from the first mounting portion;

a second electrical contact having:

a second mounting portion having a device contact portion; and a substantially linear second receptacle contact portion extending from the second mounting portion;

wherein the second mounting portion includes an intermediate extending portion that is configured in a substantially J-shaped arrangement such that the device contact portion of the second mounting portion is offset from the second receptacle contact portion; and an electrical device secured to the device contact portion of the first mounting portion and to the device contact portion of the second mounting portion;

wherein the device contact portion of the first mounting portion and the device contact portion of the second mounting portion are substantially linearly aligned with each other; and wherein the electrical device carrier contact assembly is configured to be manipulated and installed on the circuit board as a single unit.

* * * * *